US012622061B2

(12) United States Patent
Liu et al.

(10) Patent No.:  US 12,622,061 B2
(45) Date of Patent:         May 5, 2026

(54) DISPLAY PANEL AND DISPLAY DEVICE

(71) Applicant: TIANMA ADVANCED DISPLAY TECHNOLOGY INSTITUTE (XIAMEN) CO., LTD., Xiamen (CN)

(72) Inventors: Rusheng Liu, Xiamen (CN); Xiaoxiang He, Xiamen (CN)

(73) Assignee: TIANMA ADVANCED DISPLAY TECHNOLOGY INSTITUTE (XIAMEN) CO., LTD., Xiamen (CN)

( * ) Notice: Subject to any disclaimer, the term of this patent is extended or adjusted under 35 U.S.C. 154(b) by 376 days.

(21) Appl. No.: 18/319,498

(22) Filed: May 18, 2023

(65) Prior Publication Data

US 2023/0299095 A1      Sep. 21, 2023

(30) Foreign Application Priority Data

Dec. 30, 2022    (CN) .......................... 202211729901.5

(51) Int. Cl.
| | |
|---|---|
| *H01L 27/12* | (2006.01) |
| *H01L 25/16* | (2023.01) |
| *H10D 86/40* | (2025.01) |
| *H10D 86/60* | (2025.01) |

(52) U.S. Cl.
CPC ........... *H10D 86/60* (2025.01); *H01L 25/167* (2013.01); *H10D 86/451* (2025.01)

(58) Field of Classification Search
CPC ...... H10D 86/60; H10D 86/451; H10D 86/40; H01L 25/167; H01L 25/16; H01L 25/0753; H01L 25/075; H10H 29/142; H10H 29/14; H10H 29/8514; H10H 29/8325; H10H 20/855; H10H 20/01; H10H 20/835; H10H 20/832; H10H 20/857
See application file for complete search history.

(56) References Cited

U.S. PATENT DOCUMENTS

2023/0071577  A1*    3/2023   Woo ..................... H10K 59/123

\* cited by examiner

*Primary Examiner* — Nikolay K Yushin
(74) *Attorney, Agent, or Firm* — KILPATRICK TOWNSEND & STOCKTON LLP

(57) ABSTRACT
A display panel and a display device are provided. The display panel includes a substrate, a driving layer located on a side of the substrate, light-emitting elements and a light-blocking layer; the driving layer includes thin-film transistors, a first functional layer and a second functional layer, the first functional layer includes a first opening, the second functional layer includes a second opening, the first opening overlaps with the second opening in a first direction, and a size of the first opening is different from a size of the second opening in a second direction. The light-emitting element and the driving layer are located on a same side of the substrate, and the light-emitting element is electrically connected to at least part of the thin-film transistors of the driving layer. The light-blocking layer at least partially overlaps with a sidewall of the first opening in the second direction.

20 Claims, 10 Drawing Sheets

B-B

B-B

B-B

C-C

B-B

B-B

B-B

B-B

B-B

E-E

DISPLAY PANEL AND DISPLAY DEVICE

This application claims priority to Chinese Patent Application No. 202211729901.5, titled "DISPLAY PANEL AND DISPLAY DEVICE", filed on Dec. 30, 2022 with the China National Intellectual Property Administration, which is hereby incorporated by reference in its entirety.

FIELD

The present disclosure relates to the field of display technology, and more particularly, to a display panel and a display device.

BACKGROUND

Flat display panels such as liquid crystal display (LCD) panels, organic light-emitting display (OLED) panels, and display panels using light-emitting diodes (LEDs) devices such as micro light-emitting diodes (Micro LEDs) and mini light-emitting diodes (Mini LEDs) are widely used in mobile phones, TVs, personal digital assistants, digital cameras, notebook computers, desktop computers and other consumer electronics products due to their advantages such as high image quality, power saving, thin body and wide application range.

In the light-emission of the display panel, the light emitted by two adjacent sub-pixels will interfere with each other, affecting the display effect of the display panel significantly. Hence, how to reduce the interference of adjacent sub-pixels during the display process of the display panel is a problem to be solved.

SUMMARY

In view of this, a display panel and a display device are provided according to the present disclosure, which are beneficial to reduce the interference of adjacent sub-pixels of the display panel.

In one embodiment, a display panel provided according to the present disclosure includes a substrate, a driving layer located on a side of the substrate, light-emitting elements and a light-blocking layer. The driving layer includes thin-film transistors. The driving layer includes a first functional layer and a second functional layer, the first functional layer includes a first opening, the second functional layer includes a second opening, the first opening overlaps with the second opening in a first direction, and a size of the first opening is different from a size of the second opening in a second direction; the first direction is vertical to a plane where the display panel is located, and the second direction intersects with the first direction. The light-emitting elements and the driving layer are located on a same side of the substrate, and the light-emitting elements are electrically connected to at least part of the thin-film transistors of the driving layer. The light-blocking layer at least partially overlaps with a sidewall of the first opening in the second direction.

In one embodiment, a display device is provided according to the embodiments of the present disclosure. The display device includes a display panel. The display panel includes a substrate, a driving layer located on a side of the substrate, light-emitting elements and a light-blocking layer. The driving layer includes thin-film transistors. The driving layer includes a first functional layer and a second functional layer, the first functional layer includes a first opening, the second functional layer includes a second opening, the first opening overlaps with the second opening in a first direction, and a size of the first opening is different from a size of the second opening in a second direction; the first direction is vertical to a plane where the display panel is located, and the second direction intersects with the first direction. The light-emitting elements and the driving layer are located on a same side of the substrate, and the light-emitting elements are electrically connected to at least part of the thin-film transistors of the driving layer. The light-blocking layer at least partially overlaps with a sidewall of the first opening in the second direction.

BRIEF DESCRIPTION OF THE DRAWINGS

The embodiments of the present disclosure will be described below with reference to the accompanying drawings. In the drawings, same components are indicated by same reference signs. The drawings are not drawn to scale.

Figure 1:
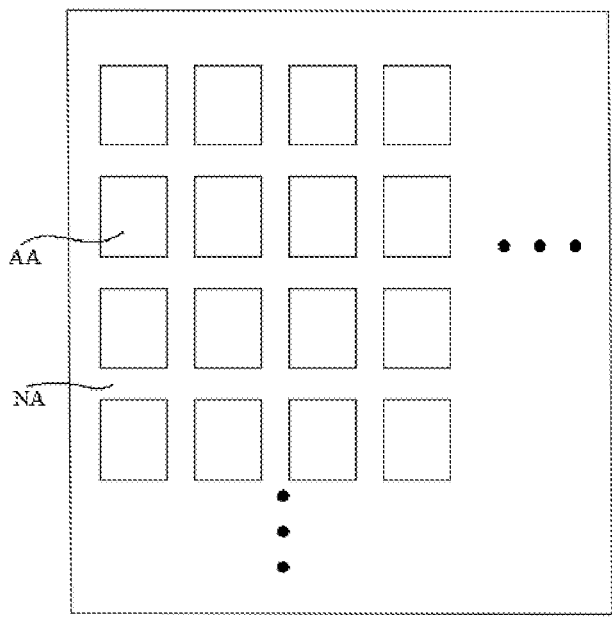
FIG. 1 is a top view of a display panel according to an embodiment of the present disclosure.

The drawings are not necessarily drawn to scale.

REFERENCE SIGNS

100: Display panel;
110: Substrate;
120: Driving layer;
121: First functional layer;
121a: First opening;
1211a: First sub-opening;
1212a: Second sub-opening;
1211: First sub-layer;

1212: Second sub-layer,
122: Second functional layer;
122*a*: Second opening;
1221: Third sub-layer,
1222: Fourth sub-layer;
123: Organic layer;
124: First shielding portion;
125: Second shielding portion;
T: Thin-film transistor;
S: Source;
D: Drain;
G: Gate;
W: Active layer;
130: Light-emitting element;
140: Light-blocking layer;
140*a*: Light-absorbing layer;
140*b*: Reflecting layer;
141: First sub-portion;
142: Second sub-portion;
142*a*: Third opening;
10: Display device;
X: First direction;
Y: Second direction;
AA: Light-emitting area;
NA: Non-light-emitting area; and
TA: Light-transmitting area.

DETAILED DESCRIPTION OF EMBODIMENTS

Embodiments of the present disclosure will be described in detail below. In the following detailed description, numerous specific details are set forth in order to provide a thorough understanding of the present disclosure. The following description of the embodiments is only to provide a better understanding of the present disclosure by showing examples thereof. In the drawings and the following description, at least some commonly known structures and techniques have not been shown in order to avoid unnecessarily obscuring the present disclosure; and, for clarity, the dimensions of some structures may be exaggerated. Furthermore, the features, structures, or characteristics described hereinafter may be combined in any suitable manner in one or more embodiments.

The size and thickness of each configuration shown in the drawings are arbitrarily shown for purpose of understanding and description, but the concept of the present disclosure is not limited thereto. In the drawings, the thickness of layers, films, panels, regions, etc., are zoomed in for clarity. In the drawings, the thicknesses of some layers and regions are zoomed in for purpose of better understanding and description.

It will be understood that when an element such as a layer, film, region, or substrate is referred to as being "on" another element, it can be directly on the other element or there may be intervening element(s). In contrast, when an element is described as being "directly on" another element, there are no intervening elements. Also, throughout the specification, the expression of "on" the target element means positioning on top of or on bottom of the target element, and does not necessarily indicate positioning "at the upper side" in the direction of gravity.

Furthermore, unless expressly stated otherwise, the word "comprising/including" will be understood to imply the inclusion of stated elements, but not the exclusion of any other elements.

During the display process of a display panel, such as an OLED display panel or a Micro-LED display panel, the light emitted by each sub-pixel irradiates the adjacent sub-pixel. In this way, for a display panel with transparent displaying, the light emitted by one sub-pixel irradiates the active layer of the thin-film transistor of the adjacent sub-pixel, and the active layer generates photogenerated carriers, which incurs risk of conduction of the source and drain of the thin-film transistor. As a result, an increase of the thin-film transistor leakage may be caused, leading to an increase of the driving current and a drift of luminance and chromaticity in the corresponding sub-pixel.

In view of this, a display panel and a display device using the display panel are provided according to embodiments of the present disclosure. Various embodiments of the display panel and the display device will be described below with reference to the drawings.

As shown in FIGS. 1 to 6, according to the present disclosure, the display panel 100 includes a substrate 110, a driving layer 120, light-emitting elements 130 and a light-blocking layer 140. The driving layer 120 is located on a side of the substrate 110, and the driving layer 120 includes thin-film transistors T. The driving layer 120 includes a first functional layer 121 and a second functional layer 122, the first functional layer 121 includes a first opening 121*a*, and the second functional layer 122 includes a second opening 122*a*. In the first direction X, the first opening 121*a* and the second opening 122*a* are overlapped. In the second direction Y, the size of the first opening 121*a* is different from the size of the second opening 122*a*. The first direction X is vertical to the plane where the display panel 100 is located, and the second direction Y intersects with the first direction X. The light-emitting elements 130 and the driving layer 120 are located on the same side of the substrate 110, and each light-emitting element 130 is electrically connected to at least part of the thin-film transistors T of the driving layer 120. In the second direction Y, the light-blocking layer 140 at least partially overlaps with a sidewall of the first opening 121*a*.

The substrate 110 may be a hard substrate such as a glass substrate; or may be a flexible substrate made of material including polyimide, polystyrene, polyethylene terephthalate, parylene, polyethersulfone or polyethylene naphthalate. The substrate 110 is mainly used to support the driving layer 120, the light-emitting elements 130, the light-blocking layer 140 and the like arranged thereon.

The driving layer 120 includes thin-film transistors T. Each thin-film transistor T includes a gate G, a source S and a drain D, and the material of the drain D, the source S and the gate G may include one or any combination of molybdenum, titanium, aluminum, copper, etc. The gate G of the thin-film transistor T is generally used to receive a control signal, and the thin-film transistor T is turned on or off under the control of the control signal. The source S or the drain D of the thin-film transistor T is connected to the sub-pixel of the light-emitting element 130 to drive the corresponding sub-pixel to emit light.

The light-emitting element 130 includes sub-pixels that emit light in different colors. Exemplarily, the light-emitting element 130 may include sub-pixels that emit red light, sub-pixels that emit green light, and sub-pixels that emit blue light. The light-emitting element 130 is electrically connected to at least part of the thin-film transistors T of the driving layer 120. Exemplarily, the sub-pixels can be electrically connected to the source S or the drain D of different thin-film transistors T, and the thin-film transistors T drive corresponding sub-pixels to emit light.

The driving layer 120 includes a first functional layer 121 and a second functional layer 122. The first functional layer 121 and the second functional layer 122 may be both made of insulating materials, and the insulation among the source S, the drain D and the gate G of the thin-film transistor T or the insulation between different thin-film transistors T is realized by the first functional layer 121 and the second functional layer 122. The first functional layer 121 and the second functional layer 122 may each include organic materials or inorganic materials.

The display surface of the display panel 100 may include light-emitting areas AAs arranged in an array and non-light-emitting areas NAs located between the light-emitting areas AAs. The light-emitting elements 130 and thin-film transistors T may be arranged in the light-emitting areas AA. For the display panel 100 with transparent display, at least part of the non-light-emitting area NA is the light-transmitting area TA of the display panel 100. The area where the first opening 121a and the second opening 122a overlap with each other in the first direction X corresponds to the non-light-emitting area NA of the display surface. For the display panel 100 with transparent display, the area where the first opening 121a and the second opening 122a overlap with each other corresponds to the light-transmitting area TA of the display panel 100.

The first functional layer 121 and the second functional layer 122 are stacked in the first direction X. The first functional layer 121 can be arranged between the second functional layer 122 and the substrate 110, and the light-emitting elements 130 are arranged on a side of the second functional layer 122 facing away from the substrate 110. In one embodiment, the second functional layer 122 is arranged between the first functional layer 121 and the substrate 110, and the light-emitting elements 130 are arranged on a side of the first functional layer 121 facing away from the substrate 110.

In a case that the first direction X intersects the second direction Y, the first direction X and the second direction Y may form an acute angle or a right angle. As an example, the first direction X and the second direction Y may be vertical to each other.

The first functional layer 121 and the second functional layer 122 may each be a single film layer formed integrally. In one embodiment, the first functional layer 121 or the second functional layer 122 may include multiple sub-layers formed separately.

In the second direction Y, the light-blocking layer 140 at least partially overlaps the sidewall of the first opening 121a. In other words, in the second direction Y, the light-blocking layer 140 may overlap with a part of the sidewall of the first opening 121a. In one embodiment, the light-blocking layer 140 may overlap with the whole sidewall of the first opening 121a.

In the embodiments of the present disclosure, in the second direction Y, the light-blocking layer 140 may just at least partially overlap with the sidewall of the first opening 121a. In one embodiment, the light-blocking layer 140 may also at least partially overlap with the sidewall of the second opening 122a.

Therefore, in an embodiment where the light-blocking layer 140 overlaps with at least part of the sidewall of the first opening 121a, the light-blocking layer 140 covers at least part of the sidewall of the first functional layer 121 facing the first opening 121a. In an embodiment where the light-blocking layer 140 overlaps with at least part of the sidewall of the first opening 121a and at least part of the second opening 122a, the light-blocking layer 140 further covers at least part of the sidewall of the second functional layer 122 facing the second opening 122a.

The light-blocking layer 140 may include at least one of a light-absorbing material and a reflecting material. In an embodiment where the light-blocking layer 140 includes a light-absorbing material, the light-blocking layer 140 has light-absorbing property, and can absorb the light that one sub-pixel irradiates towards an adjacent sub-pixel, to prevent light emitted by one subpixel from irradiating the adjacent subpixel. In the embodiment where the light-blocking layer 140 includes a reflecting material, the light-blocking layer 140 can reflect back the light that one sub-pixel irradiates towards other sub-pixels, which can also prevent the light emitted by one sub-pixel from irradiating adjacent sub-pixel.

It can be understood that, by arranging the light-blocking layer 140 to cover the sidewall of the first opening 121a, the effect that the light-blocking layer 140 blocks the light emitted by corresponding sub-pixel can be used to reduce the chance that the light emitted by the corresponding sub-pixel irradiates the adjacent sub-pixel.

In the second direction Y, the size of the first opening 121a is different from that of the second opening 122a. In an embodiment, the first opening 121a may be greater than the second opening 122a. Or, the first opening 121a may be less than the second opening 122a. In this way, a step is formed at the edge of the junction of the first functional layer 121 and the second functional layer 122. In this way, related materials can be arranged on the sidewall of the first functional layer 121 to improve the bonding force between the light-blocking layer 140 and the sidewall of the first opening 121a.

Exemplarily, the bonding force between the light-blocking layer 140 and the second functional layer 122 is greater than the bonding force between the light-blocking layer 140 and the first functional layer 121, and the area where the first opening 121a is greater than the second opening 122a is filled with the second functional layer 122, and the light-blocking layer 140 is in contact with the material of the second functional layer 122, which is beneficial to improve the bonding force between the light-blocking layer 140 and the sidewall of the first opening 121a. In one embodiment, the bonding force between the light-blocking layer 140 and the second functional layer 122 is less than the bonding force between the light-blocking layer 140 and the first functional layer 121, then the area where the first opening 121a is greater than the second opening 122a can be filled with the light-blocking layer 140, and at least part of the light-blocking layer 140 is clamped at the step between the first functional layer 121 and the second functional layer 122. In this way, the contact area between the light-blocking layer 140 and the first functional layer 121 can be increased and the bonding force between the light-blocking layer 140 and the first functional layer 121 is further improved.

In the embodiment of the present disclosure, the first opening 121a of the first functional layer 121 overlaps with the second opening 122a of the second functional layer 122, and the overlapped part of the first opening 121a and the second opening 122a can be the light-transmitting area TA of the transparent display panel. The sidewall of the overlapped part of the first opening 121a and the second opening 122a is the sidewall of the light-transmitting area TA. And the light-blocking layer 140 is arranged at the sidewall of the light-transmitting area TA, to block the light irradiating into the display panel 100 through the light-transmitting area TA.

According to an embodiment of the present disclosure, by arranging the light-blocking layer 140 to overlap with at least part of the sidewall of the first opening 121a in the second direction Y and using the light-blocking effect of the light-blocking layer 140, the light emitted by the corresponding sub-pixel of the light-emitting element 130 is blocked to some extent. In this way, the possibility that the light emitted by the sub-pixel of the light-emitting unit 130 passes through the adjacent sub-pixel is reduced. As a result, the risk that the light emitted by the sub-pixel of the light-emitting element 130 irradiates the active layer W of the adjacent sub-pixel to form carriers is lowered, which is conducive to improving the accuracy of the driving current of each sub-pixel of the light-emitting element 130, reducing the risk of luminance or chromaticity drift of the corresponding sub-pixel, and further improving the display effect of the display panel 100.

Figure 2:
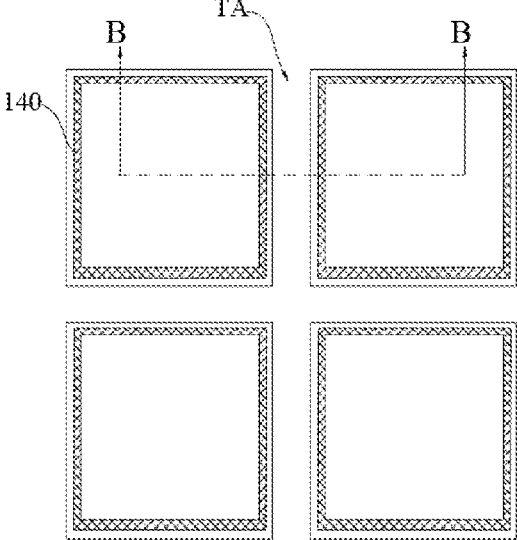
FIG. 2 is a partial structural diagram of a display panel according to an embodiment of the present disclosure.
Figure 3:
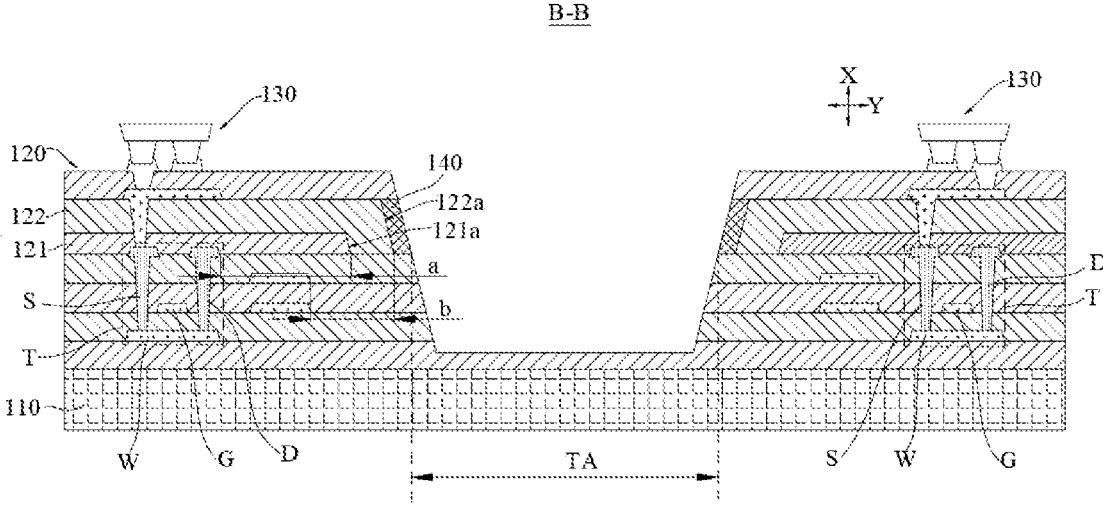
FIG. 3 is a sectional view of FIG. 2 along B-B direction.
Figure 4:
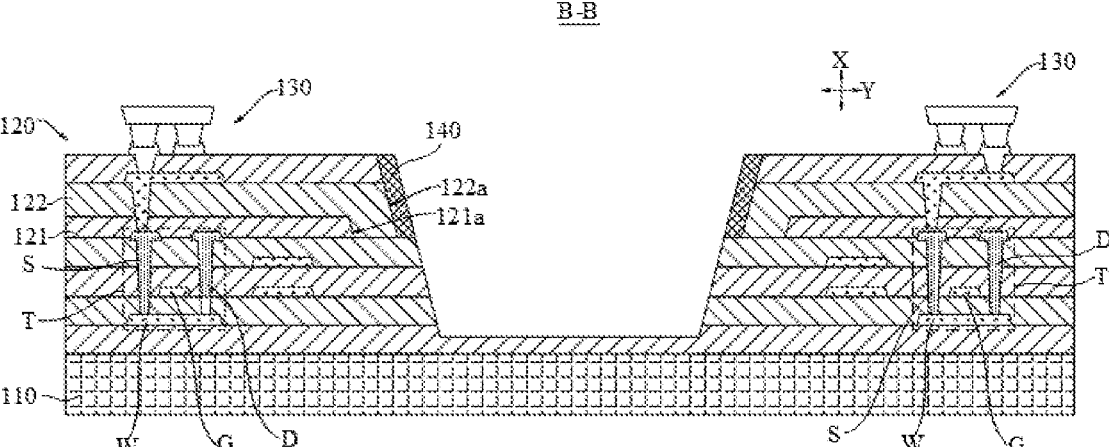
FIG. 4 is another sectional view of FIG. 1 along B-B direction.

As shown in FIG. 2 and FIG. 3, in some embodiments, the first functional layer 121 includes an inorganic material, and the minimum distance a between the sidewall of the first opening 121*a* and the thin film transistors T in the second direction Y satisfies: a≥3 μm.

As an example, a may be 3 μm, 4 μm, 5 μm or 6 μm, etc.

The minimum distance a between the sidewall of the first opening 121*a* and the thin-film transistors T in the second direction Y, is the distance from the sidewall of the first functional layer 121 facing the first opening 121*a* to the sidewall of the part of the closest thin-film transistor T arranged at the first functional layer 121 facing the second opening 122*a* in the second direction Y.

By arranging a≥3 μm, it is beneficial to ensure the covering of the first functional layer 121 on the thin-film transistor T, and reduce the risk of partial structural insulation failure of the thin-film transistor T caused by failure of insulation of the first functional layer 121 to the thin-film transistor T, to ensure the normal operation of the thin-film transistor T.

Further referring to FIG. 2 and FIG. 3, in some embodiments, the light-blocking layer 140 is at least partially arranged on a side of the driving layer 120 facing away from the substrate 110. In the second direction Y, the minimum distance b between the sidewall of the light-blocking layer 140 close to the first functional layer 121 and the sidewalls of the thin-film transistors T satisfies: b≥2 μm.

Exemplarily, b may be 2 μm, 3 μm, 4 μm, 5 μm or 6 μm, etc.

The thin-film transistor T can have a part that is not arranged on the first functional layer 121, and the sidewall of the thin-film transistor T which is at the minimum distance from the sidewall of the first functional layer 121 in the second direction Y may be located on the first functional layer 121. In one embodiment, the sidewall of the thin-film transistor T which is at the minimum distance from the sidewall of the first functional layer 121 in the second direction Y may be located on other layer which is at the side of the first functional layer 121 facing the substrate 110. Therefore, the sidewalls of the thin-film transistors T which are at the minimum distance from the sidewall of the first functional layer 121 in the second direction Y may at least partially overlap in the second direction Y, or may interlace in the second direction Y.

The light-blocking layer 140 is at least partially arranged on the side of the driving layer 120 facing away from the substrate 110, and this part of the light-blocking layer 140 can block the external ambient light from irradiating the thin-film transistor T.

By arranging b≥2 μm, it is beneficial to ensure the covering of the light-blocking layer 140 on the thin-film transistor T, and reduce the risk of affecting the normal operation of the thin-film transistor T due to external ambient light irradiating the thin-film transistor T through the display surface.

Figure 5:
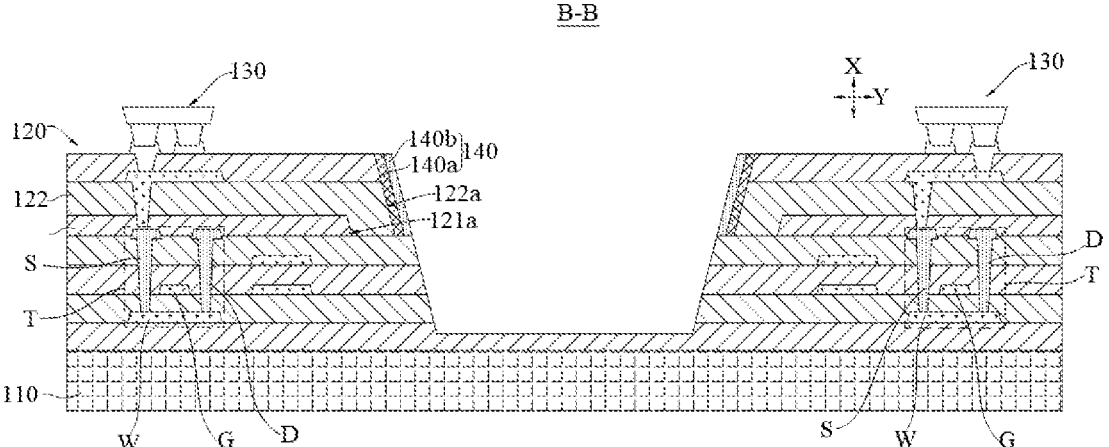
FIG. 5 is yet another sectional view of FIG. 2 along B-B direction.
Figure 6:
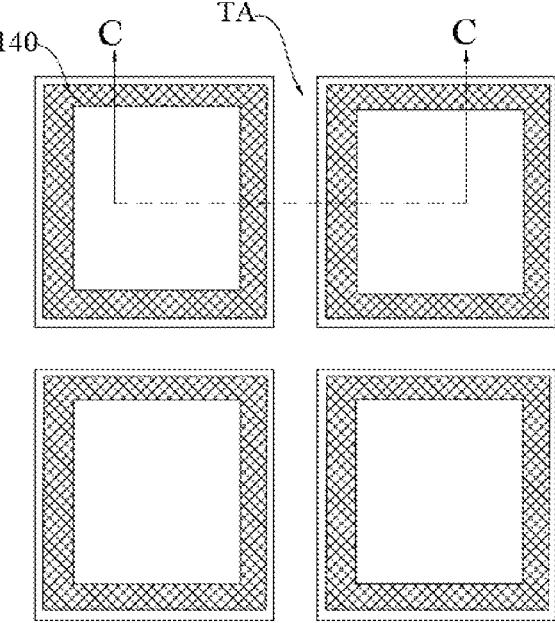
FIG. 6 is a partial structural diagram of a display panel according to another embodiment of the present disclosure.
Figure 7:
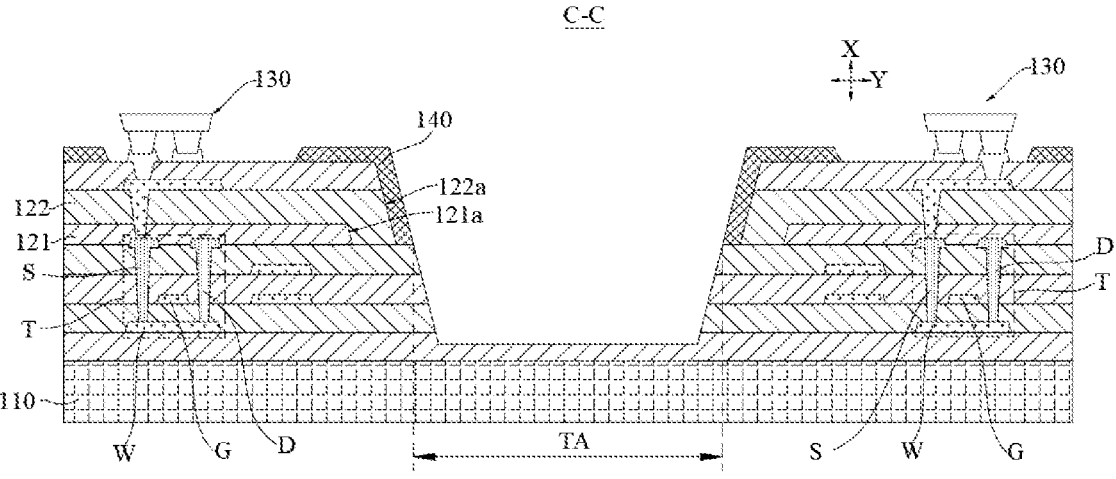
FIG. 7 is a sectional view of FIG. 6 along C-C direction.
Figure 8:
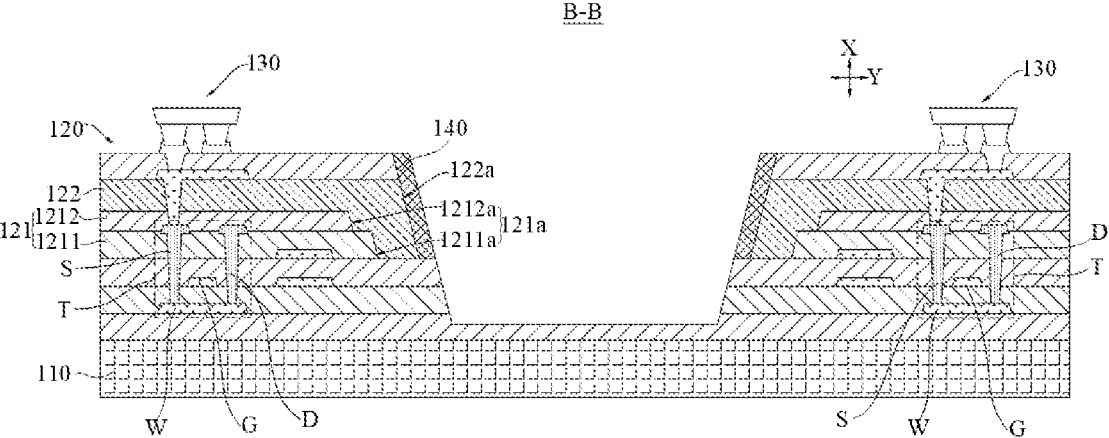
FIG. 8 is yet another sectional view of FIG. 2 along B-B direction.

As shown in FIG. 2 and FIG. 5, in some embodiments, the light-blocking layer 140 includes at least one of a light-absorbing layer 140*a* and a reflecting layer 140*b*. The light-absorbing layer 140*a* includes a light-absorbing material, and the light-reflecting layer includes a reflecting material.

In the embodiments of the present disclosure, the light-blocking layer 140 may only include the light-absorbing layer 140*a*, or only include the reflecting layer 140*b*. In one embodiment, the light-blocking layer 140 may include the light-absorbing layer 140*a* and the reflecting layer 140*b* both.

The light-absorbing layer 140*a* includes a light-absorbing material. Exemplarily, the light-absorbing layer 140*a* may include a black organic material or a black inorganic material. The light-reflecting layer includes a light-reflecting material. Exemplarily, the material of the light-reflecting layer can be various materials with light-reflecting effect.

The light-absorbing layer 140*a* can absorb the light that the sub-pixel of the light-emitting element 130 irradiates towards the light-absorbing layer 140*a*, and the reflecting layer 140*b* can reflect the irradiating light back to prevent the light from irradiating towards adjacent sub-pixel. Therefore, the light-blocking layer 140 may include any one of the light-absorbing layer 140*a* and the reflecting layer 140*b*, and in either case the light emitted by the sub-pixel of the light-emitting element 130 can be prevented from irradiating the adjacent sub-pixel. In addition, the light-absorbing layer 140*a* can also reduce the possibility that the light emitted by the sub-pixel of the light-emitting element 130 is reflected to the active layer W of its own thin-film transistor T, which would result in an increase of the driving current of its own thin-film transistor T, to help to reduce the possibility of luminance or chromaticity drift. Therefore, arranging the light-blocking layer 140 to include at least one of the light-absorbing layer 140*a* and the reflecting layer 140*b* can further reduce the risk that the light emitted by the sub-pixel of the light-emitting element 130 irradiates the adjacent sub-pixel and affects the driving current of adjacent sub-pixel.

Further referring to FIG. 2 and FIG. 5, in some embodiments, the light-blocking layer 140 includes a light-absorbing layer 140*a* and a reflecting layer 140*b* stacked in the second direction Y. And the light-absorbing layer 140*a* is arranged on the side of the reflecting layer 140*b* facing the first functional layer 121.

In this way, the light emitted by sub-pixel can be absorbed by the light-absorbing layer 140*a* when irradiating towards adjacent sub-pixel. By doing so, the light-blocking layer 140 can prevent not only the light emitted by sub-pixel from irradiating towards adjacent sub-pixel and passing through the light-emitting area AA where the adjacent sub-pixel are located, or prevent the light emitted by the sub-pixel from irradiating the active layers W of the adjacent sub-pixel, but also prevent the light emitted by the sub-pixel from being reflected by the light-blocking layer 140 and irradiating the active layer W of the sub-pixel.

In addition, due to the existence of the reflecting layer 140*b*, a small portion of light absorbed by the light-absorbing layer 140*a* can be reflected back, to be prevented from irradiating adjacent sub-pixel. The reflecting layer 140*b* can also reflect the external ambient light irradiating the reflecting layer 140*b*, to reduce the possibility that the ambient light imposes negative impact on the normal display of the display panel 100.

Therefore, by arranging the light-blocking layer 140 to include the reflecting layer 140*b* and the light-absorbing layer 140*a*, and arranging the light-absorbing layer 140*a* on the side of the reflecting layer 140*b* facing the first functional layer 121, it is beneficial to further reduce the risk of mutual interference between adjacent sub-pixels, which is further beneficial to reduce the risk of luminance and chromaticity drift caused by the increase of the driving current of each sub-pixel.

It can be understood that when the light emitted by the sub-pixel irradiates to one side of the display surface, or to one side of the substrate 110, part of the light will undergo multiple total reflections at the interface of involved layers. As a result, light may eventually be emitted from adjacent sub-pixel, causing interference to the light emission of adjacent sub-pixel. By arranging the light-blocking layer 140, it is possible to lower the risk that the light emitted by the sub-pixel is emitted from the light-emitting area corresponding to the adjacent sub-pixels after multiple reflections, reducing the risk of mutual interference of light emitted from adjacent sub-pixels.

As shown in FIG. 2, FIG. 4, FIG. 6 and FIG. 7, in some embodiments, in the second direction Y, the light-blocking layer 140 at least partially overlaps with the sidewall of the second opening 122*a*.

In this way, the light-blocking layer 140 overlaps with at least part of the sidewall of the first opening 121*a* and overlaps with at least part of the sidewall of the second opening 122*a* in the second direction Y. The light-blocking layer 140 can block the light emitted by the sub-pixel of the light-emitting element 130 from irradiating the adjacent sub-pixel through the sidewall of the first functional layer 121 and the second functional layer 122, which is beneficial to further improve the light-blocking effect of the light-blocking layer 140.

As shown in FIGS. 2 and 3, in some embodiments, the material of the first functional layer 121 includes an inorganic material. And the material of the second functional layer 122 includes an organic material. The second functional layer 122 is located on the first functional layer 121 facing away from the substrate 110. In the second direction Y, the size of at least part of the first opening 121*a* is greater than the size of the second opening 122*a*.

The first functional layer 121 includes an inorganic material, and the second functional layer 122 includes an organic material, then the second functional layer 122 can be a planarization layer arranged on the first functional layer 121. And, the size of the first opening 121*a* is greater than that of the second opening 122*a*, and the side edges of the first functional layer 121 and the second functional layer 122 form a step, and the size of the first functional layer 121 is less than the size of the second functional layer 122 in the second direction Y.

In this way, in a case that the light-blocking layer 140 includes an inorganic material, since the material of the first functional layer 121 includes an inorganic material, there is a high bonding force between the inorganic material and the inorganic material, and a part of the light-blocking layer 140 can be directly in contact with the sidewall of the first functional layer 121, and can fills the part where the first opening 121*a* is greater than the second opening 122*a*, and the second functional layer 122 has a clamping effect on the light-blocking layer 140, which increases the contact area of the light-blocking layer 140 and the first functional layer 121 and the second functional layer 122, which is beneficial to improve the bonding force of the driving layer 120 to the light-blocking layer 140.

In a case that the light-blocking layer 140 includes an organic material, the organic material can be filled in the part where the first opening 121*a* is greater than the second opening 122*a*. For example, the second functional layer 122 can be filled in the part where the first opening 121*a* is greater than the second opening 122*a*, and the light-blocking layer 140 can be in contact with the organic material, to improve the bonding force of the driving layer 120 to the light-blocking layer 140.

Hence, by arranging the first functional layer 121 to include an inorganic material and the second functional layer 122 to include an organic material, and arranging the size of the first opening 121*a* in the second direction Y to be greater than the size of the second opening 122*a* in the second direction Y, it is beneficial to improve the bonding force of the driving layer 120 to the light-blocking layer 140, which reduces the risk of the light-blocking layer 140 falling off, and is beneficial to improve the structure strength of the display panel 100.

As shown in FIG. 2, FIG. 8, FIG. 9 and FIG. 10, in some embodiments, the first functional layer 121 includes a first sub-layer 1211 and a second sub-layer 1212. The second sub-layer 1212 is located on a side of the first sub-layer 1211 facing away from the substrate 110. The first opening 121*a* includes a first sub-opening 1211*a* and a second sub-opening 1212*a*. The first sub-opening 1211*a* is arranged corresponding to the first sub-layer 1211, and the second sub-opening 1212*a* is arranged corresponding to the second sub-layer 1212. The size of the first sub-opening 1211*a* is less than the size of the second sub-opening 1212*a* in the second direction Y.

By arranging the first functional layer 121 to include the first sub-layer 1211 and the second sub-layer 1212, in the second direction Y, the light-blocking layer 140 can overlap with the first sub-layer 1211 and the second sub-layer 1212 to improve the light blocking effect of the light-blocking layer 140.

In the second direction Y, the size of the first sub-opening 1211*a* is less than the size of the second sub-opening 1212*a*, then in the second direction Y, the size of the first sub-layer 1211 is greater than the size of the second sub-layer 1212, and the second sub-layer 1212 and the first sub-layer 1211 can form a step. In an embodiment where the light-blocking layer 140 includes an organic material, the organic material such as the second functional layer 122 can be filled in the area where the second sub-layer 1212 shrinks with respect to the first sub-layer 1211 in the second direction Y, and the light-blocking layer 140 is in contact with the organic material to improve the bonding force of the driving layer 120 to the light-blocking layer 140. In the embodiment where the light-blocking layer 140 includes an inorganic material, the light-blocking layer 140 can be filled in the area where the second sub-layer 1212 shrinks with respect to the first sub-layer 1211, to increase the contact area of the light-blocking layer 140 and the first sub-layer 1211, which is also beneficial to increase the bonding force of the driving layer 120 to the light-blocking layer 140.

Figure 9:
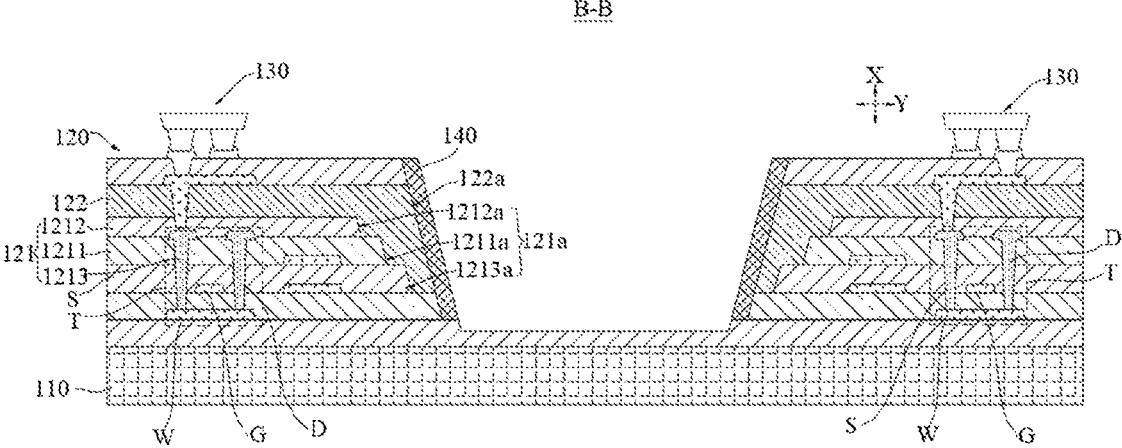
FIG. 9 is yet another sectional view of FIG. 2 along B-B direction.
Figure 10:
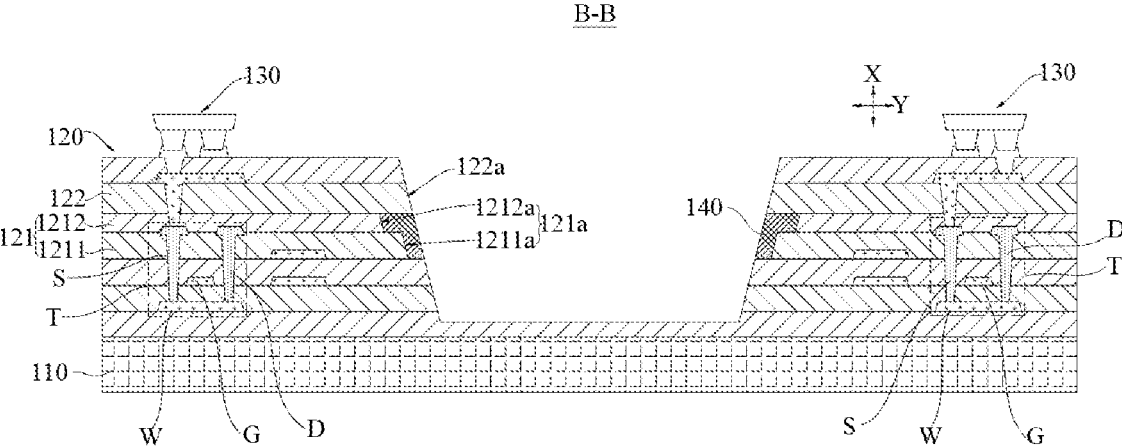
FIG. 10 is yet another sectional view of FIG. 2 along B-B direction.

In the embodiments of the present disclosure, the first functional layer 121 can also be arranged to include other sub-layers. For example, as shown in FIG. 9, the fifth sub-layer 1213 is arranged on a side of the first sub-layer 1211 facing the substrate 110. The fifth sub-layer 1213 is arranged to include a third sub-opening 1213*a*. In the second direction Y, the size of the fifth sub-layer 1213 is greater than the size of the first sub-layer 1211, and a step can be formed at the junction of the first sub-layer 1211 and the fifth sub-layer 1213, which further improves the binding force between the first functional layer 121 and the second functional layer 122, and further improves the bonding force between of driving layer 120 to the light-blocking layer 140. The first functional layer 121 may be arranged to include more sub-layers.

Therefore, the first functional layer 121 is arranged to include the first sub-layer 1211 and the second sub-layer 1212, and the size of the first sub-opening 1211a is arranged to be less than the size of the second sub-opening 1212a. In this way, in addition to improving the light-blocking effect of the light-blocking layer 140 to the sub-pixel, it is beneficial to further improve the bonding force between the driving layer 120 and the light-blocking layer 140, to improve the stability of the structure of the display panel 100.

Figure 11:
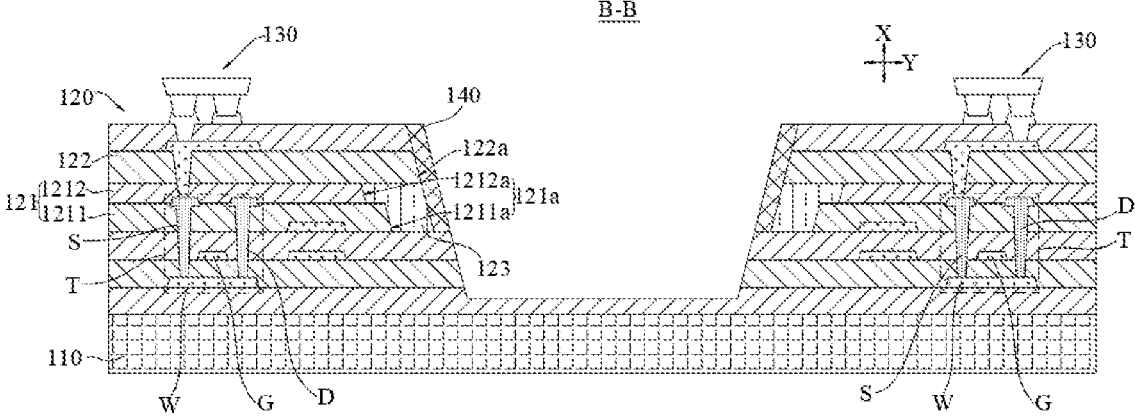
FIG. 11 is yet another sectional view of FIG. 2 along B-B direction.
Figure 12:
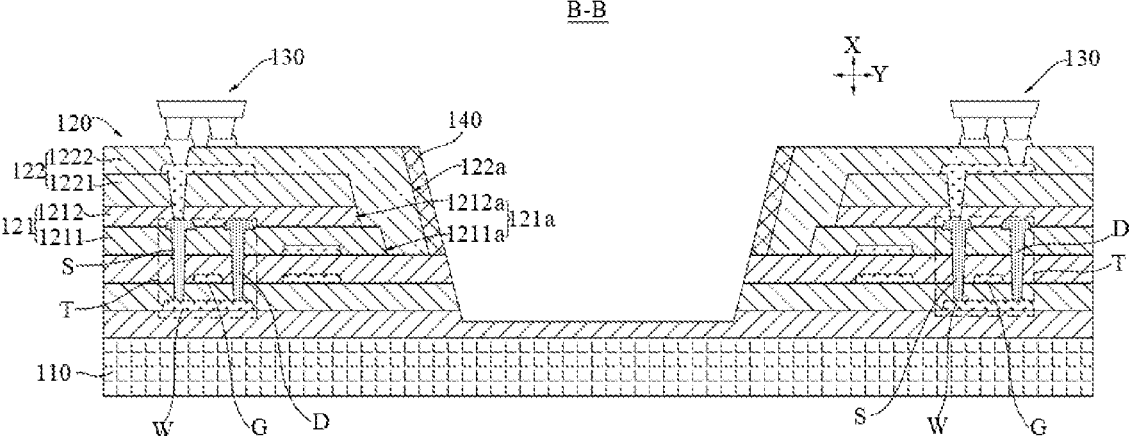
FIG. 12 is yet another sectional view of FIG. 2 along B-B direction.

As shown in FIG. 2 and FIG. 11, in some embodiments, the driving layer 120 further includes an organic layer 123. The organic layer 123 is arranged in the first opening 121a and adjoins the sidewall of the first opening 121a. The material of the light-blocking layer 140 includes an organic material, and the light-blocking layer 140 is in contact with the sidewall of the organic layer 123 facing away from the first functional layer 121.

There is a relatively high bonding force between organic materials. By arranging the organic layer 123 and arranging the organic layer 123 in the first opening 121a, the light-blocking layer 140 can adjoin the organic layer 123, and there is a high bonding force between the organic layer 123 and the light-blocking layer 140, which is beneficial to improve the bonding force between the driving layer 120 and the light-blocking layer 140, to improve the structure strength of the display panel 100.

Further referring to FIG. 2 and FIG. 11, in some embodiments, the sidewall of the organic layer 123 facing away from the first functional layer 121 is flush with the sidewall of the second opening 122a.

By arranging that the sidewall of the organic layer 123 facing away from the first functional layer 121 is flush with the sidewall of the second opening 122a, the light-blocking layer 140 can have a flat structure in the first direction X, to facilitate the manufacture of the light-blocking layer 140, which is beneficial to simplify the manufacturing process of the display panel 100.

As shown in FIG. 2, FIG. 5, FIG. 6 and FIG. 7, in some embodiments, the organic layer 123 and the second functional layer 122 are made of the same material and integrally formed.

In this way, in the process of manufacturing the display panel 100, after the first functional layer 121 is manufactured, the second functional layer 122 and the organic layer 123 are integrally formed in the process of manufacturing the second functional layer 122, which is beneficial to improve the bonding strength of the second functional layer 122 and the organic layer 123, to improve the structure strength of the display panel 100. In one embodiment, since the organic layer 123 and the second functional layer 122 are integrally formed, it is beneficial to simplify the manufacturing process of the display panel 100.

Figure 13:
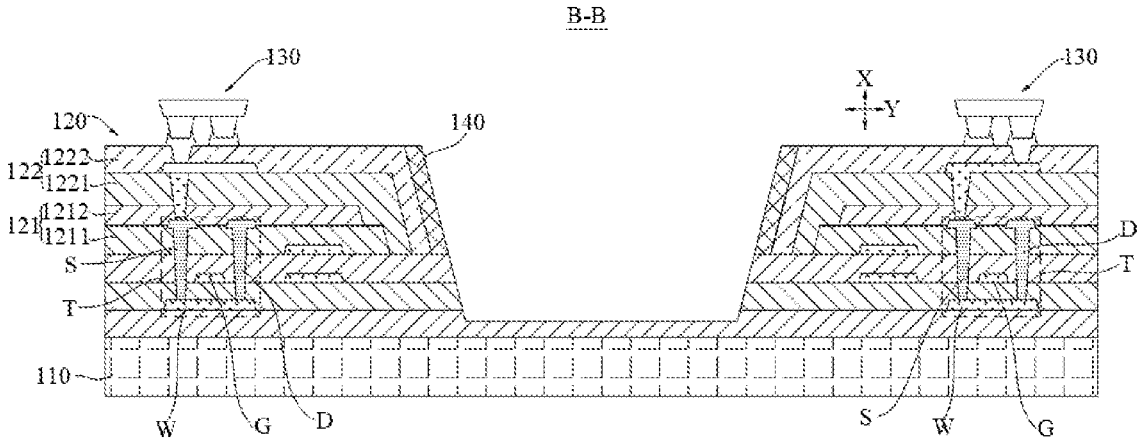
FIG. 13 is yet another sectional view of FIG. 2 along B-B direction.
Figure 14:
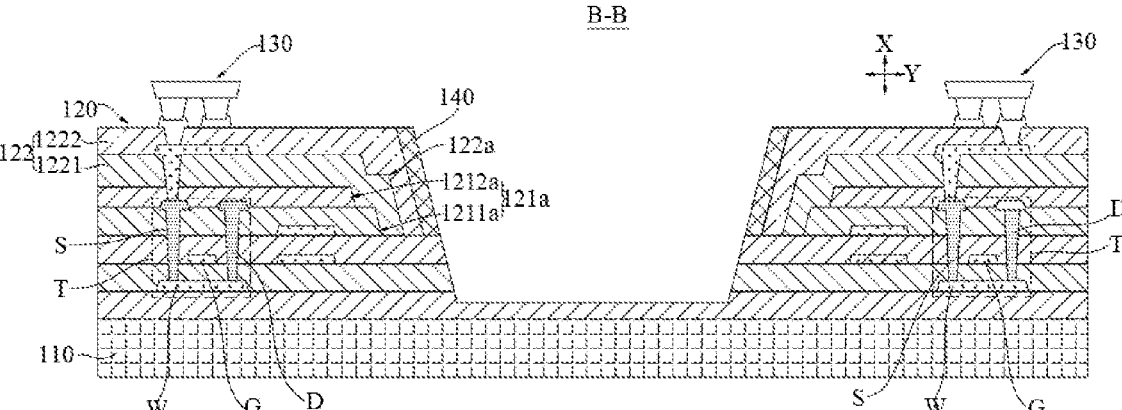
FIG. 14 is yet another sectional view of FIG. 2 along B-B direction.

As shown in FIG. 2, FIG. 13 and FIG. 14, in some embodiments, the second functional layer 122 includes a third sub-layer 1221 and a fourth sub-layer 1222. The fourth sub-layer 1222 is located on a side of the third sub-layer 1221 facing away from the substrate 110, and the organic layer 123 is integrally formed with at least one of the third sub-layer 1221 and the fourth sub-layer 1222.

In the embodiments of the present disclosure, the third sub-layer 1221 may be arranged to be integrally formed with the organic layer 123. In one embodiment, the fourth sub-layer 1222 may be integrally formed with the organic layer 123. In one embodiment, both the third sub-layer 1221 and the fourth sub-layer 1222 are integrally formed with the organic layer 123.

By arranging the organic layer 123 integrally formed with at least one of the third sub-layer 1221 and the fourth sub-layer 1222, on the premise of ensuring the bonding force of the driving layer 120 to the light-blocking layer 140 and improving the structure strength of the display panel 100, it is beneficial to simplify the manufacturing process of the display panel 100.

Figure 15:
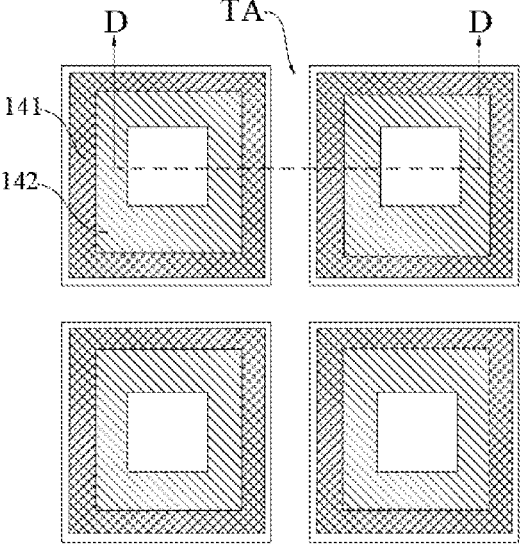
FIG. 15 is a partial structural diagram of a display panel according to yet another embodiment of the present disclosure.
Figure 16:
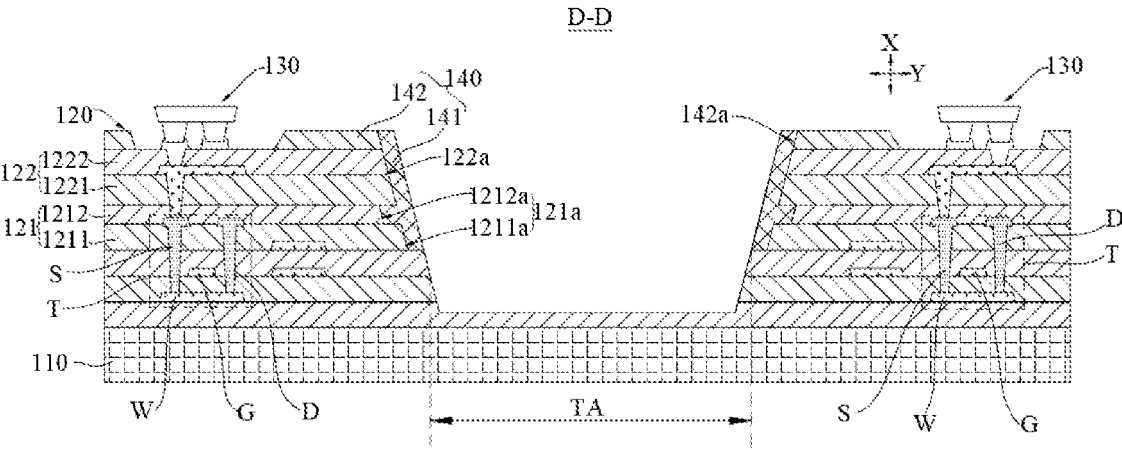
FIG. 16 is a sectional view of FIG. 15 along D-D direction.

As shown in FIGS. 15 and 16, in some embodiments, the light-blocking layer 140 includes a first sub-portion 141, the material of the first sub-portion 141 includes an inorganic material, and at least part of the first sub-portion 141 is connected to the sidewall of the first opening 121a.

In the embodiments of the present disclosure, the light-blocking layer 140 may only include the first sub-portion 141. In one embodiment, the light-blocking layer 140 may include other parts. All of the first sub-portion 141 may be connected to the sidewall of the first opening 121a. In one embodiment, the first sub-portion 141 is further connected to the sidewall of the second opening 122a. The arrangement can be determined according to actual needs, which is not limited herein.

Since the first functional layer 121 includes an inorganic material, the material of the first sub-portion 141 is arranged to include an inorganic material. And the first sub-portion 141 is arranged to be connected to the first functional layer 121. In this way, it is beneficial to improve the bonding force of the first functional layer 121 to the first sub-portion 141, to improve the bonding force of the driving layer 120 to the light-blocking layer 140, to improve the structure strength of the display panel 100.

In some embodiments, the material of the first sub-portion 141 includes at least one of chromium oxide and metal.

Exemplarily, the metal may be copper or silver or the like. Both chromium oxide and metal have a good light-blocking capability, and both chromium oxide and metal have high bonding force with inorganic materials. Therefore, by arranging the material of the first sub-portion 141 to include chromium oxide and metal, it is beneficial to ensure the bonding force between the first sub-portion 141 and the first functional layer 121 on the premise of ensuring the light-blocking capability of the sub-portion 141, to improve the structure strength of the display panel 100.

Further referring to FIG. 15 and FIG. 16, in some embodiments, the light-blocking layer 140 further includes a second sub-portion 142 connected to the first sub-portion 141, the material of the second sub-portion 142 includes an organic material, and at least part of the second sub-portion 142 is arranged on the side of the second functional layer 122 facing away from the first functional layer 121.

As at least part of second sub-portion 142 is arranged on the side of the second functional layer 122 facing away from the first functional layer 121, the second sub-portion 142 can be used to block the external ambient light from irradiating the thin-film transistor T, and the thin-film transistor T can normally drive the light-emitting element 130 to emit light.

In the embodiments of the present disclosure, the second sub-portion 142 may be arranged only on the side of the second functional layer 122 facing away from the first functional layer 121. In one embodiment, a part of the second sub-portion 142 is arranged on the side of the second functional layer 122 facing the second opening 122a, which is not limited here.

Since the material of the second functional layer 122 includes an organic material, the light-blocking layer 140 is arranged to include the second sub-portion 142, and the second sub-portion 142 is arranged to include an organic material, which is beneficial to improve the bonding force between the second sub-portion 142 and the second functional layer 122.

In this way, there is relatively high bonding force between the first sub-portion 141 and the first functional layer 121 and between the second sub-portion 142 and the second functional layer 122, which is further beneficial to improve the bonding force of the driving layer 120 to the light-blocking layer 140, to improve the overall structure strength of the display panel 100. In addition, it helps to improve the light blocking effect of the light-blocking layer 140.

In some embodiments, the second sub-portion 142 has a third opening 142a. In the first direction X, the overlapped portion of the first opening 121a and the second opening 122a overlaps with the third opening 142a, and the first sub-portion 141 is connected to a sidewall of the third opening 142a.

Exemplarily, the sidewall of the third opening 142a may be arranged to be flush with the sidewall of the second opening 122a. In one embodiment, in the first direction X, the third opening 142a covers the second opening 122a.

The second sub-portion 142 is arranged to have a third opening 142a, and the first sub-portion 141 is arranged to be connected to the third opening 142a. In this way, in the manufacturing process of the display panel 100, after the second sub-portion 142 is formed, the first opening 121a, the second opening 122a and the third opening 142a can then be formed by etching and the like process, and then the light-blocking layer 140 is formed in the first opening 121a, the second opening 122a and the third opening 142a simultaneously, which is beneficial to simplify the manufacturing process of the display panel 100. Since the first sub-portion 141 is in contact with the sidewall of the second sub-portion 142, it is beneficial to improve the bonding strength between the first sub-portion 141 and the second sub-portion 142, to improve the structure strength of the light-blocking layer 140, which is further conducive to improving the structure strength of the display panel 100.

Further referring to FIG. 13 and FIG. 16, in some embodiments, the first functional layer 121 includes a first sub-layer 1211 and a second sub-layer 1212, and the second sub-layer 1212 is located on a side of the first sub-layer 1211 facing away from the substrate 110. The first opening 121a includes a first sub-opening 1211a and a second sub-opening 1212a, the first sub-opening 1211a is arranged corresponding to the first sub-layer 1211, and the second sub-opening 1212a is arranged corresponding to the second sub-layer 1212. In the second direction Y, the size of the second sub-opening 1212a is greater than the size of the second sub-opening 1212a, and is greater than the size of the second opening 122a. The first sub-portion 141 is connected to the sidewall of the first sub-opening 1211a and the sidewall of the second sub-opening 1212a.

In the second direction Y, the size of the second sub-opening 1212a is greater than the size of the first sub-opening 1211a, and greater than the size of the second opening 122a, and the first sub-portion 141 is arranged to connect to the sidewall of the first sub-opening 1211a. In this way, a part of the first sub-portion 141 is clamped between the first sub-layer 1211 and the second functional layer 122, which is conducive to further improving the bonding force between the driving layer 120 and the light-blocking layer 140, to improve the structure strength of the display panel 100.

Figure 17:
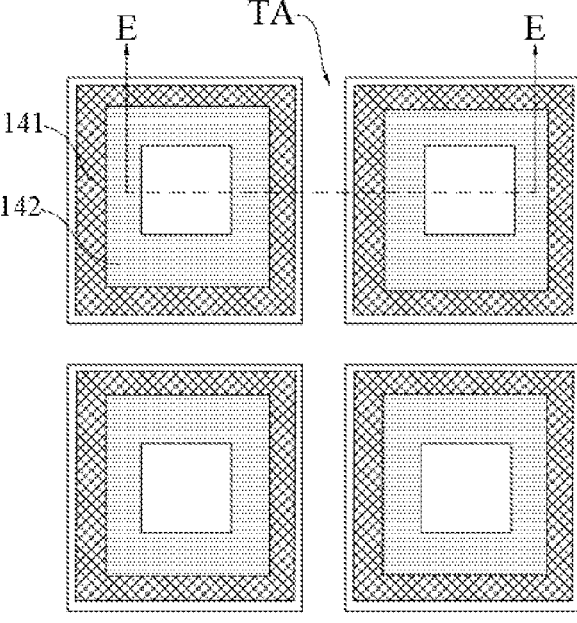
FIG. 17 is a partial structural diagram of a display panel according to yet another embodiment of the present disclosure.
Figure 18:
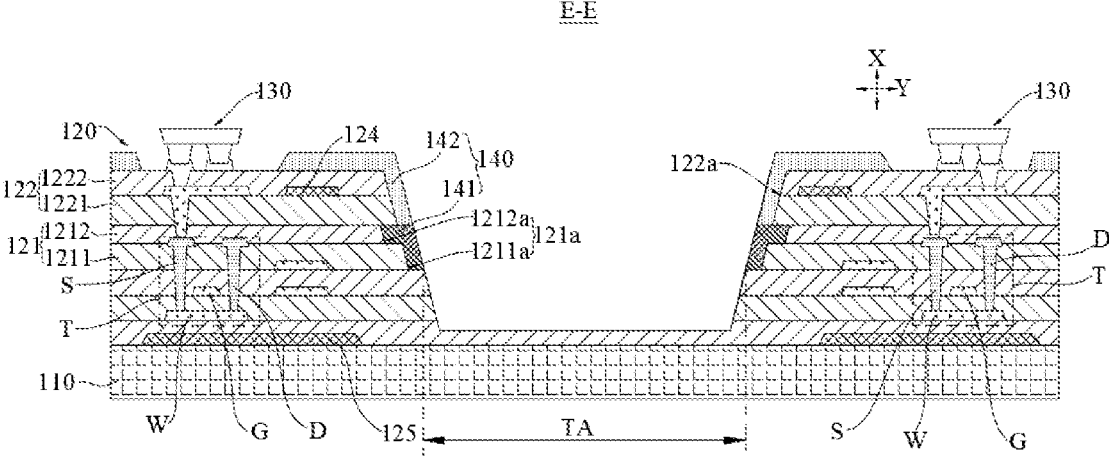
FIG. 18 is a sectional view of FIG. 17 along E-E direction.

As shown in FIG. 17 and FIG. 18, in some embodiments, the second sub-portion 142 is further connected to the sidewall of the second opening 122a.

Since the second sub-portion 142 includes an organic material and the second functional layer 122 also includes an organic material, considering good bonding force between organic materials, the second sub-portion 142 is further connected to the sidewall of second opening 122a. In other words, the second sub-portion 142 is arranged to be in contact with the sidewall of the second functional layer 122 facing the second opening 122a, to further improve the bonding force between the second functional layer 122 and the light-blocking layer 140, to improve the structure strength of the display panel 100.

In the embodiments of the present disclosure, the first sub-portion 141 may be arranged to include a light-reflecting material, and the second sub-portion 142 may be arranged to include a light-absorbing material. In the second direction Y, the size of the second sub-portion 142 is greater than that of the first sub-portion 141, and the first sub-portion 141 has the function of light reflection, while the second sub-portion 142 has the function of light absorption. In one embodiment, the first sub-portion 141 can be arranged to include a light-absorbing material, while the second sub-portion 142 can be arranged to include a light-reflecting material. Both cases can prevent light from passing through the light-blocking layer 140, reducing the risk of light emitted by a sub-pixel irradiating the adjacent sub-pixel.

As shown in FIG. 2 and FIG. 9, in some embodiments, the thin-film transistor T includes an active layer W, and the light-blocking layer 140 overlaps with at least part of the active layer W in the second direction Y.

If the light emitted by the sub-pixel of the light-emitting element 130 irradiates the active layer W of the adjacent sub-pixel, the active layer W may generate carriers, thus affecting the driving current of the corresponding thin-film transistor T, causing a risk of luminance or chromaticity drift of the adjacent sub-pixel.

By arranging the light-blocking layer 140 to at least partially overlap with the active layer W in the second direction Y, it is beneficial to reduce the risk that the light emitted by the sub-pixel irradiates the active layer W of the adjacent sub-pixel, to help to reduce the luminance or chromaticity drift caused by the increase of the driving current of the corresponding sub-pixel, which is beneficial to improve the display effect of the display panel 100.

Referring to FIG. 17 and FIG. 18, in some embodiments, the driving layer 120 further includes a first shielding portion 124, and the second functional layer 122 is located on a side of the first functional layer 121 facing away from the substrate 110. The first shielding portion 124 is arranged in the second functional layer 122. The first shielding portion 124 may include materials with the light-blocking function such as metal, metal oxide, organic substance or inorganic substance and the like, to prevent external ambient light from irradiating the active layer W, further helping to lower the risk of affecting the driving current of the thin-film transistor T due to the external ambient light irradiating the active layer W.

Further referring to FIGS. 17 and 18, in some embodiments, the driving layer 120 further includes a second shielding portion 125, and both the first functional layer 121 and the second functional layer 122 are located on the side of the second shielding portion 125 facing away from the substrate 110. The second shielding portion 125 may include a single layer or multiple layers of materials with the light-blocking function such as metal, metal oxide or organic material and the like, to prevent external ambient light from irradiating from one side of the substrate 110 to the active layer W of the thin-film transistor T, which is further beneficial to lower the risk of affecting the driving current of the thin-film transistor T due to external ambient light irradiating the active layer W.

Figure 19:
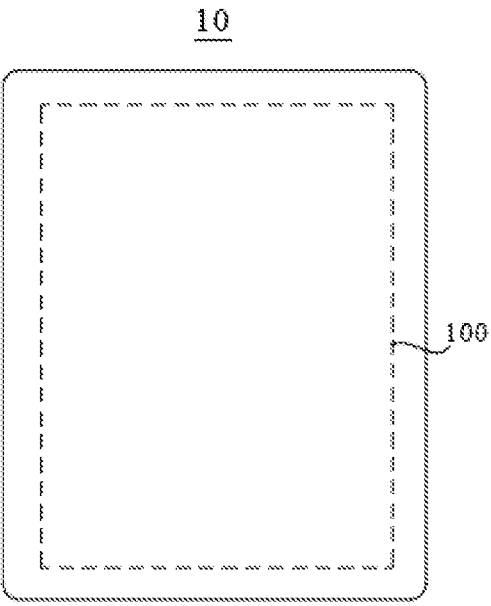
FIG. 19 is a top view of a display device according to an embodiment of the present disclosure.

As shown in FIG. 19, a display device 10 is provided according to an embodiment of the present disclosure, the display device 10 includes the display panel 100 provided according to any of the foregoing embodiments.

In the embodiment of the present disclosure, the display device 10 includes but not limited to mobile phone, personal digital assistant (PDA), tablet computer, e-book, television, access control, smart fixed phone, console and other devices with display function.

According to the embodiment of the present disclosure, the display device 10 utilizing the display panel 100 provided according to any of the foregoing embodiments has the same benefits, which will not be repeated here.

Although the present disclosure has been described with reference to embodiments, various modifications may be made and equivalents may be substituted for elements thereof without departing from the scope of the present disclosure. In particular, as long as there is no structural conflict, the features mentioned in the various embodiments can be combined in any manner.

What is claimed is:

1. A display panel comprising:
    a substrate;
    a driving layer located on a side of the substrate, wherein the driving layer comprises thin-film transistors, and the driving layer comprises a first functional layer and a second functional layer, the first functional layer comprises a first opening, the second functional layer comprises a second opening, wherein the first opening overlaps with the second opening in a first direction; a size of the first opening is different from a size of the second opening in a second direction; the first direction is vertical to a plane where the display panel is located, and the second direction intersects with the first direction, the second direction is parallel to a plane where the display panel is located;
    light-emitting elements, wherein the light-emitting elements and the driving layer are located on a same side of the substrate, and the light-emitting elements are electrically connected to at least part of the thin-film transistors in the driving layer; and
    a light-blocking layer, wherein the light-blocking layer at least partially overlaps with a sidewall of the first opening in the second direction, and wherein the light-blocking layer is in direct contact with at least one of the sidewall of the first opening or a sidewall of the second opening.

2. The display panel according to claim 1, wherein the first functional layer comprises an inorganic material, and a minimum distance a between the sidewall of the first opening and the thin-film transistors in the second direction satisfies: a≥3 μm.

3. The display panel according to claim 1, wherein the light-blocking layer is at least partially arranged on a side of the driving layer facing away from the substrate, and a minimum distance b between a sidewall of the light-blocking layer close to the first functional layer and sidewalls of the thin-film transistors in the second direction satisfies: b≥2 μm.

4. The display panel according to claim 1, wherein the light-blocking layer at least partially overlaps with a sidewall of the second opening in the second direction.

5. The display panel according to claim 1, wherein each thin-film transistor comprises an active layer, and the light-blocking layer overlaps with at least part of the active layer in the second direction.

6. The display panel according to claim 1, wherein the light-blocking layer comprises at least one of a light-absorbing layer and a reflecting layer, the light-absorbing layer comprises a light-absorbing material, and the reflecting layer comprises a light-reflecting material.

7. The display panel according to claim 6, wherein the light-blocking layer comprises the light-absorbing layer and the reflecting layer stacked in the second direction, and the light-absorbing layer is arranged on a side of the reflecting layer facing toward the first functional layer.

8. The display panel according to claim 1, wherein a material of the first functional layer comprises an inorganic material, a material of the second functional layer comprises an organic material, the second functional layer is located on a side of the first functional layer facing away from the substrate, and the size of the first opening is greater than the size of the second opening in the second direction.

9. The display panel according to claim 8, wherein the first functional layer comprises a first sub-layer and a second sub-layer, the second sub-layer is located on a side of the first sub-layer facing away from the substrate, the first opening comprises a first sub-opening and a second sub-opening, the first sub-opening is arranged corresponding to the first sub-layer, and the second sub-opening is arranged corresponding to the second sub-layer, and a size of the first sub-opening is less than a size of the second sub-opening in the second direction.

10. The display panel according to claim 8, wherein the driving layer further comprises an organic layer, the organic layer is arranged in the first opening and is in contact with the sidewall of the first opening, a material of the light-blocking layer comprises an organic material, and the light-blocking layer is in contact with a sidewall of the organic layer facing away from the first functional layer.

11. The display panel according to claim 10, wherein a sidewall of the organic layer facing away from the first functional layer is flush with a sidewall of the second opening.

12. The display panel according to claim 10, wherein the organic layer and the second functional layer are made of a same material and are formed integrally.

13. The display panel according to claim 12, wherein the second functional layer comprises a third sub-layer and a fourth sub-layer, the fourth sub-layer is located on a side of the third sub-layer facing away from the substrate, and the organic layer is formed with at least one of the third sub-layer and the fourth sub-layer integrally.

14. The display panel according to claim 8, wherein the light-blocking layer comprises a first sub-portion, a material of the first sub-portion comprises an inorganic material, and at least part of the first sub-portion is connected to the sidewall of the first opening.

15. The display panel according to claim 14, wherein a material of the first sub-portion comprises at least one of chromium oxide and metal.

16. The display panel according to claim 14, wherein the light-blocking layer further comprises a second sub-portion connected to the first sub-portion, a material of the second sub-portion comprises an organic material, and at least part of the second sub-portion is arranged on a side of the second functional layer facing away from the first functional layer.

17. The display panel according to claim 16, wherein the second sub-portion has a third opening, an overlapped portion of the first opening and the second opening overlaps with the third opening in the first direction, and the first sub-portion is connected to a sidewall of the third opening.

18. The display panel according to claim 16, wherein the first functional layer comprises a first sub-layer and a second sub-layer, the second sub-layer is located on a side of the first sub-layer facing away from the substrate, the first opening comprises a first sub-opening and a second sub-opening, the first sub-opening is arranged corresponding to the first sub-layer, and the second sub-opening is arranged corresponding to the second sub-layer; a size of the second sub-opening is greater than a size of the first sub-opening and is greater than the size of the second opening in the second direction; the first sub-portion is connected to a sidewall of the first sub-opening and is connected to a sidewall of the second sub-opening.

19. The display panel according to claim 18, wherein the second sub-portion is further connected to a sidewall of the second opening.

20. A display device comprising a display panel, wherein the display panel comprises:

a substrate;

a driving layer located on a side of the substrate, wherein the driving layer comprises thin-film transistors, and the driving layer comprises a first functional layer and a second functional layer, the first functional layer comprises a first opening, the second functional layer comprises a second opening, wherein the first opening overlaps with the second opening in a first direction; a size of the first opening is different from a size of the second opening in a second direction; the first direction is vertical to a plane where the display panel is located, and the second direction intersects with the first direction, the second direction is parallel to a plane where the display panel is located;

light-emitting elements, wherein the light-emitting elements and the driving layer are located on a same side of the substrate, and the light-emitting elements are electrically connected to at least part of the thin-film transistors in the driving layer; and a light-blocking layer, wherein the light-blocking layer at least partially overlaps with a sidewall of the first opening in the second direction, and wherein the light-blocking layer is in direct contact with at least one of the sidewall of the first opening or a sidewall of the second opening.

* * * * *